United States Patent
Kawahara et al.

(10) Patent No.: US 10,290,699 B2
(45) Date of Patent: May 14, 2019

(54) METHOD FOR FORMING TRENCH CAPACITOR HAVING TWO DIELECTRIC LAYERS AND TWO POLYSILICON LAYERS

(71) Applicant: Texas Instruments Incorporated, Dallas, TX (US)

(72) Inventors: Hideaki Kawahara, Plano, TX (US); Binghua Hu, Plano, TX (US); Sameer Pendharkar, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/245,511

(22) Filed: Aug. 24, 2016

(65) Prior Publication Data
US 2018/0061932 A1 Mar. 1, 2018

(51) Int. Cl.
H01L 49/02 (2006.01)
H01L 21/283 (2006.01)
H01L 21/311 (2006.01)
H01L 21/768 (2006.01)
H01L 23/535 (2006.01)

(52) U.S. Cl.
CPC ........... *H01L 28/60* (2013.01); *H01L 21/283* (2013.01); *H01L 21/31111* (2013.01); *H01L 21/76895* (2013.01); *H01L 23/535* (2013.01)

(58) Field of Classification Search
None
See application file for complete search history.

(56) References Cited

U.S. PATENT DOCUMENTS

| | | | | |
|---|---|---|---|---|
| 5,315,142 A * | 5/1994 | Acovic | ................ | G11C 16/12 257/316 |
| 6,297,086 B1 * | 10/2001 | Hegde | ............... | H01L 27/10867 257/E21.653 |
| 2004/0036051 A1 * | 2/2004 | Sneh | ................ | H01L 27/10861 251/301 |
| 2007/0296010 A1 * | 12/2007 | Su | ......................... | H01L 21/743 257/301 |
| 2009/0289291 A1 * | 11/2009 | Cheng | .................... | H01L 21/84 257/301 |
| 2010/0276805 A1 * | 11/2010 | Tu | ....................... | H01L 23/5223 257/760 |
| 2012/0139080 A1 * | 6/2012 | Wang | .................... | H01L 21/743 257/506 |
| 2012/0261804 A1 * | 10/2012 | Li | ....................... | H01L 27/0255 257/653 |
| 2012/0267759 A1 * | 10/2012 | Shroff | ................. | H01L 27/0629 257/532 |
| 2015/0221718 A1 * | 8/2015 | Rhie | ...................... | H01L 28/90 257/534 |
| 2016/0172314 A1 * | 6/2016 | Cheng | .................. | H01L 23/564 257/509 |

* cited by examiner

*Primary Examiner* — Thien F Tran
(74) *Attorney, Agent, or Firm* — Jacqueline J. Garner; Charles A. Brill; Frank D. Cimino

(57) ABSTRACT

An integrated trench capacitor and method for making the trench capacitor is disclosed. The method includes forming a trench in a silicon layer, forming a first dielectric on the exposed surface of the trench, performing an anisotropic etch of the first dielectric to expose silicon at the bottom of the trench, implanting a dopant into exposed silicon at the bottom of the trench, forming a first polysilicon layer over the first dielectric, forming a second dielectric over the first polysilicon layer, and forming a second polysilicon layer over the second dielectric to fill the trench.

15 Claims, 5 Drawing Sheets

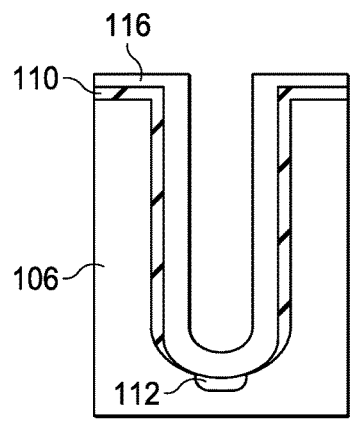 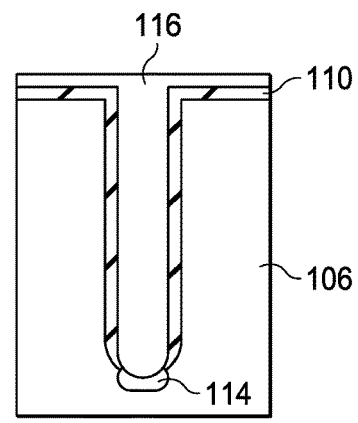
FIG. 4A        FIG. 4B
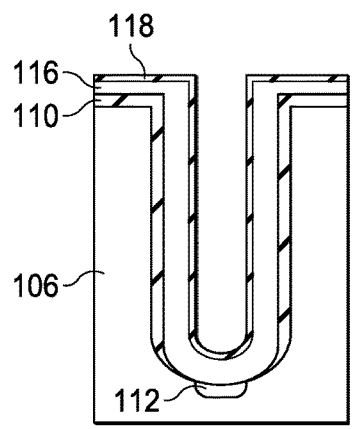 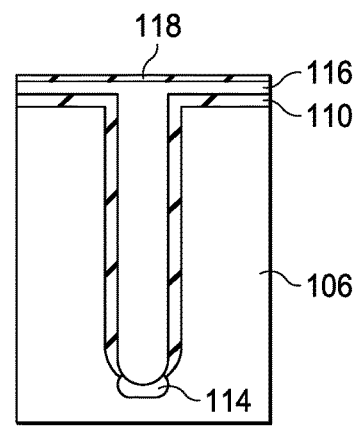
FIG. 5A        FIG. 5B
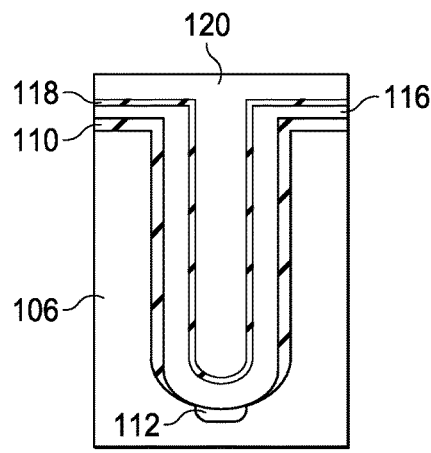 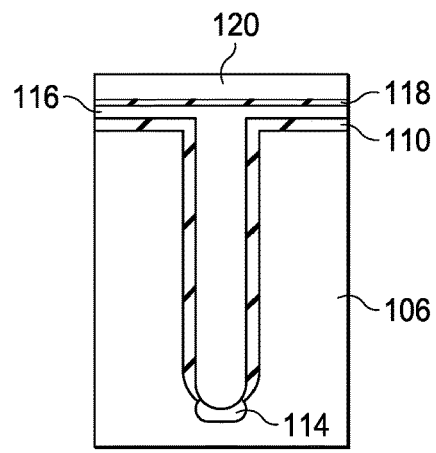
FIG. 6A        FIG. 6B

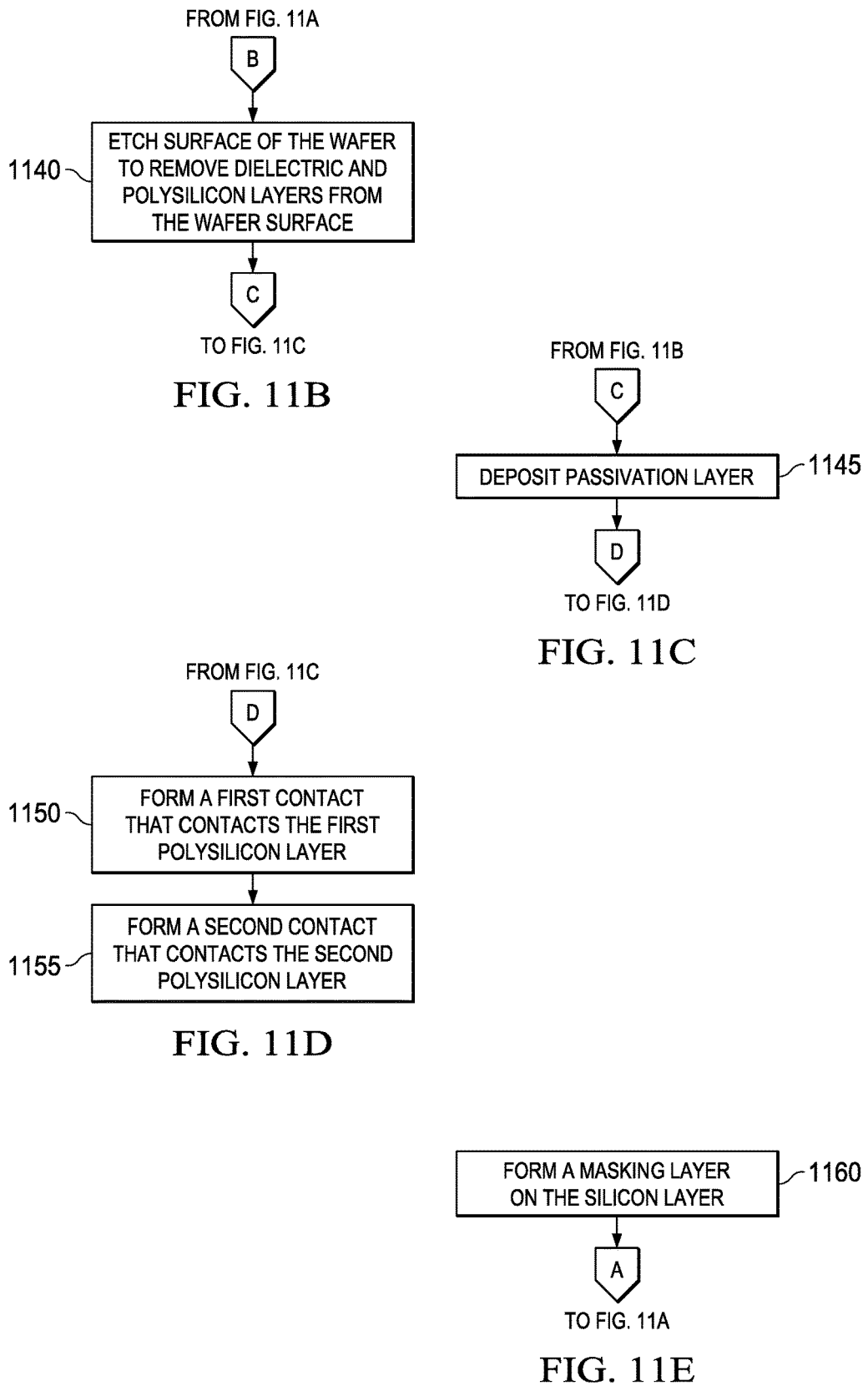

METHOD FOR FORMING TRENCH CAPACITOR HAVING TWO DIELECTRIC LAYERS AND TWO POLYSILICON LAYERS

FIELD OF THE DISCLOSURE

Disclosed embodiments relate generally to the field of semiconductor processing. More particularly, and not by way of any limitation, the present disclosure is directed to a trench isolated capacitor.

BACKGROUND

There is a demand for high density capacitance in some integrated circuits. Trench capacitors are good candidates, but they come with additional costs, such as one or more extra process masks and additional flows. In circuits that already have trench structures, e.g., substrate contacts, the addition of trench capacitors to existing flows adds to the existing complexity in order to avoid impacting the existing trench structures. An improved method of integrating high density capacitors into existing flows is desired.

SUMMARY

Disclosed embodiments disclose a high density trench capacitor that can be formed simultaneously with a substrate contact that is formed in a deep trench structure. A method of making the trench capacitor is also disclosed using an existing process for creating substrate contacts. Utilizing an existing process means that integration of the capacitors requires no new masks and adds only minimal processing to the existing flows.

In one aspect, an embodiment of a method of forming a trench capacitor in a semiconductor wafer is disclosed. The method includes forming a trench in a silicon layer; forming a first dielectric on the exposed surface of the trench; performing an anisotropic etch of the first dielectric to expose silicon at the bottom of the trench; implanting a dopant into exposed silicon at the bottom of the trench; forming a first polysilicon layer over the first dielectric; forming a second dielectric over the first polysilicon layer; and forming a second polysilicon layer over the second dielectric to fill the trench.

In another aspect, an embodiment of an integrated trench capacitor is disclosed. The integrated trench capacitor includes a first dielectric that lines a deep trench in a semiconductor; a first polysilicon layer overlying the first dielectric, wherein the first polysilicon layer is shorted to the semiconductor at the bottom of the deep trench; a second polysilicon layer that fills a central portion of the deep trench, the second polysilicon layer being separated from the first polysilicon layer by a second dielectric; a first contact that provides electrical connectivity to the first polysilicon layer; and a second contact that provides electrical connectivity to the second polysilicon layer.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

FIGS. 1A-9A depict the process of forming a trench capacitor according to an embodiment of the disclosure;

FIGS. 1B-9B depict the process of forming a substrate contact simultaneously with forming the capacitor of FIGS. 1A-9A;

FIGS. 11A-E depict a simplified flowchart for forming an integrated capacitor according to an embodiment of the disclosure.

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 12:
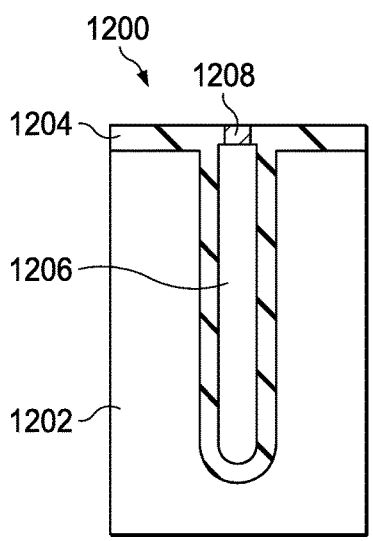
FIG. 12 depicts a trench capacitor as known in the prior art.

FIG. 12 discloses a trench capacitor 1200 as is known in the art. As seen in this figure, a trench capacitor can be formed in a deep trench that is etched into a doped region 1202 of a semiconductor. Once the trench is formed, a layer of oxide or other dielectric 1204 is formed over the exposed surface of the trench, then the rest of the trench is filled with doped polysilicon 1206 to form capacitor 1200. A contact 1208 is formed to the inner layer of polysilicon while region 1202 is connected to ground through the substrate (not specifically shown). Formation of capacitor 1200 requires a mask to be added to the process, as well as the noted steps. When a substrate contact is desired in the same layout as a capacitor, providing for both of these features at the same time can be difficult.

Figure 1A:
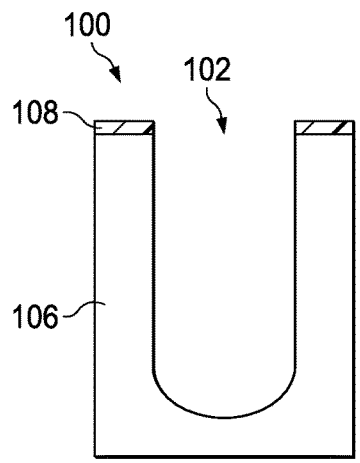
Figure 1B:
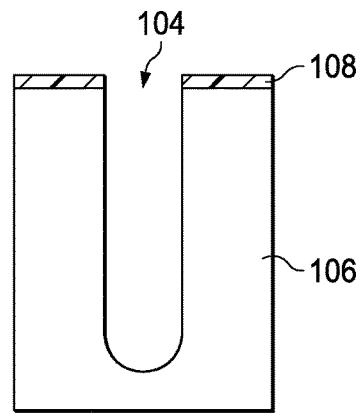

The disclosed capacitor is formed simultaneously with a deep substrate contact, such that integrating the capacitor adds no masks and only two processing steps to the existing flow for forming the substrate contact. Accordingly, the process of forming the two devices will be explained at the same time. FIGS. 1-9 disclose various points in the process of forming the two deep trench structures. At each point, the figure having a suffix of "A" depicts the formation of the trench capacitor while the figure having a suffix of "B" depicts the formation of the substrate contact. As seen in FIGS. 1A-B, trench 102 for a capacitor and trench 104 for a substrate contact are both formed in silicon layer 106, which can be either the substrate of the wafer, an epitaxial layer grown on the substrate or a combination of the two. To form the trenches, a mask layer 108 is formed on silicon layer 106 and patterned with openings over the desired sites for the trenches. In at least one embodiment, the masking layer is a metal-oxide hardmask, such as a Ti, W, and Zr oxide that is deposited in a spin-on process. In another embodiment, the masking layer can be a photoresist. A hardmask may particularly be indicated when the desired depth of the trench capacitor is large.

Etching is performed to create trenches 102 and 104 and mask layer 108 may be removed. In one embodiment, the depth of the trenches is approximately 20 microns. In other embodiments, the depth of the trenches can be in the range of 5 to 70 microns. Although not necessarily visible in these drawings, the diameter or width of trench 102 is greater than the diameter or width of trench 104. It will be recognized that the figures accompanying this application are not necessarily drawn to scale. In one embodiment, trench 102 has a width of approximately 3 microns, while trench 104 has a width of approximately 1 micron. In other embodiments, the width of trench 102 can be in the range of 2 to 10 microns, while the width of trench 104 can be in the range of 1 to 5 microns. As we shall see below, this difference in width makes a large difference in the way various layers are formed in these different trenches.

Figure 2A:
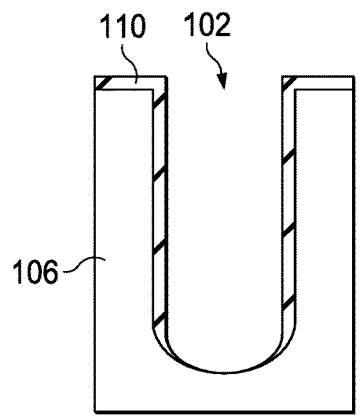
Figure 2B:
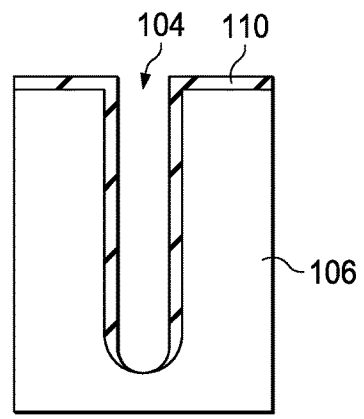
Figure 3A:
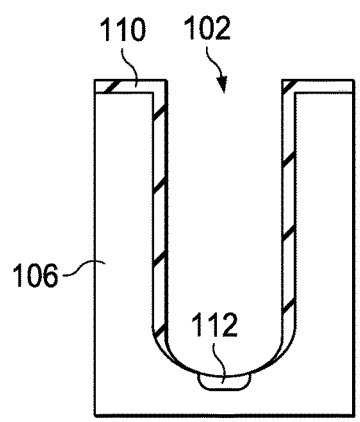
Figure 3B:
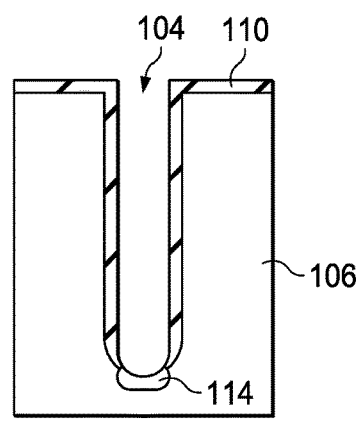

In FIGS. 2A and 2B, a thin thermal oxide is grown on the exposed silicon, followed by sub-atmospheric chemical vapor deposition of silicon oxide to form liner 110. In one embodiment, the thermal oxide is 2000 Å thick. A dry etch, e.g., using Reactive Ion Etch (RIE) is performed on trenches 102, 104 to etch through liner 110 at the bottom of the respective trenches to contact silicon layer 106. It will be understood that the reference herein to the "bottom" of the trenches 102, 104 refers to the orientation of the capacitor and substrate contacts as seen in the accompanying figures, i.e., the closed end of the trench. In FIGS. 3A and 3B, a dopant is implanted into the silicon at the bottom of trenches 102, 104 to provide contacts 112, 114 with the substrate. In at least one embodiment, the substrate is P-type and boron is implanted, although other P-type dopants can also be used. In one embodiment, an N-type dopant can be used with an N-type substrate and phosphorus is implanted. In one embodiment, the doping level of contacts 112, 114 is approximately $1-5 \times 10^{19}/cm^3$. Up to this point, the processing has produced essentially the same results in both structures, but as the process moves forward from here, the different widths of the two trenches cause different results.

In FIGS. 4A and 4B, a thin, doped polysilicon layer 116 is deposited on the wafer. In one embodiment, polysilicon layer 116 has a thickness of approximately 0.6 microns. This thickness of polysilicon will completely fill trench 104, which has a diameter, e.g., of 1.0 microns, but will only provide a lining on the sides of trench 102, which has a diameter, e.g., of 3 microns. In one embodiment, the doping level of polysilicon layer 116 is approximately $1-5 \times 10^{19}/cm^3$. In FIGS. 5A and 5B, dielectric layer 118 is deposited on top of polysilicon layer 116. In trench 102, dielectric layer 118 forms a second liner such that polysilicon layer 116 is sandwiched between two dielectric layers, except where polysilicon layer 116 contacts silicon layer 106. Since trench 104 was already filled, dielectric layer 118 is just deposited on the surface over the substrate contact. In one embodiment, dielectric layer 118 is an oxide and is deposited to a thickness of 200 Å. In one embodiment, dielectric layer 118 is an oxide/nitride/oxynitride (ONO) layer having a thickness of approximately 100-1000 Å.

Figure 7A:
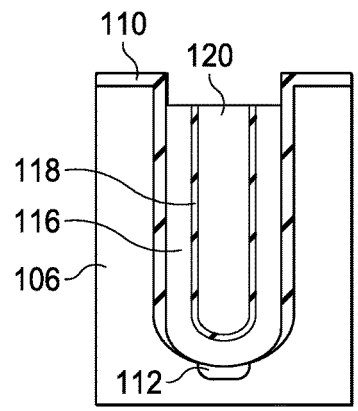
Figure 7B:
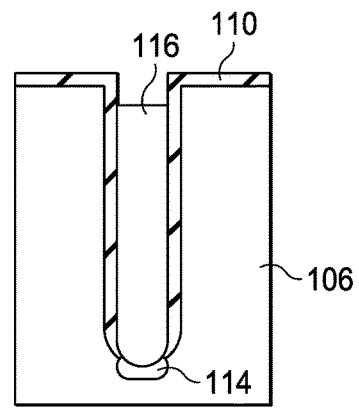
Figure 8A:
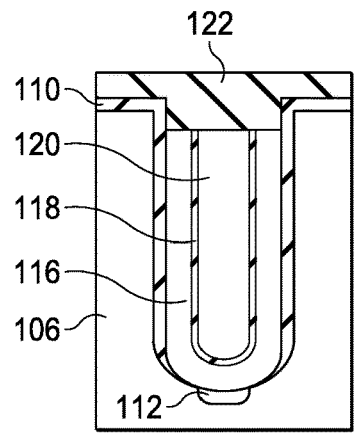
Figure 8B:
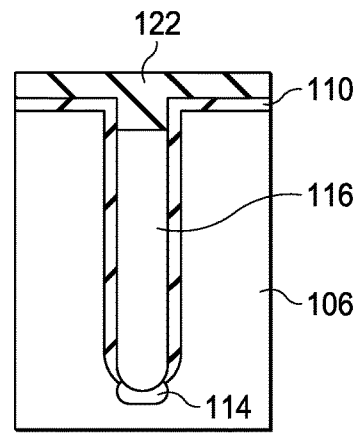
Figure 9A:
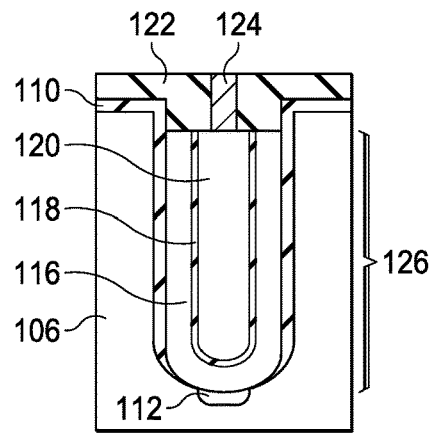
Figure 9B:
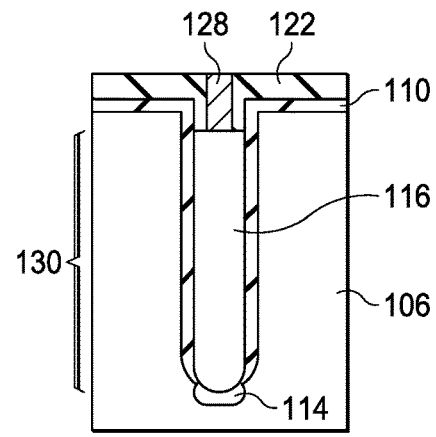

Looking next at FIGS. 6A and 6B, a polysilicon layer 120 is deposited. Polysilicon layer 120 completely fills trench 102 and forms a layer on the surface over trench 104. It will be recognized that the thickness of polysilicon layer 120 can vary, depending on the width of trench 102. In one embodiment, polysilicon layer 120 is 10000 Å thick and has a doping level of approximately $1-5 \times 10^{19}/cm^3$. In FIGS. 7A and 7B, the surface of the wafer is etched back to remove polysilicon layer 116, dielectric layer 118 and polysilicon layer 120 from the surface of the wafer, leaving the structures seen in these two figures. In FIGS. 8A and 8B, passivation layer 122 is deposited over the chip and in FIGS. 9A and 9B, contact 124 is formed to polysilicon layer 120 of capacitor 126 and contact 128 is formed to substrate contact 130, completing the process as far as these two structures are concerned. Of course, further processing can be performed on the wafer to form structures not shown in this figure.

Figure 10:
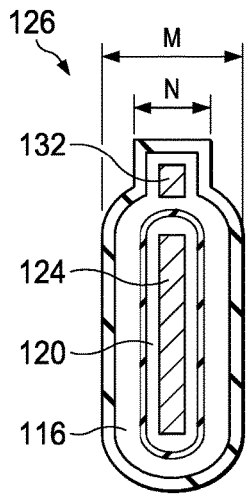
FIG. 10 depicts a top view of a capacitor according to an embodiment of the disclosure.

It can be seen in capacitor 126 that two capacitor plates have been formed, with polysilicon layer 116 forming a bottom plate and polysilicon layer 120 forming a top plate. One skilled in the art will recognize that with polysilicon layer 116 contacting silicon layer 106, polysilicon layer 116 will be grounded and polysilicon layer 120 will have the higher voltage. Notably, we have only shown an external contact to polysilicon layer 120 in the figures so far. There are at least two different methods to provide a contact to polysilicon layer 116. In a first embodiment, a substrate contact 130 is formed next to capacitor 126, so that the substrate contact 130 provides contact to the bottom plate of capacitor 126 through silicon layer 106. A second embodiment is shown in FIG. 10, which depicts a top-down view of capacitor 126. In this embodiment, the main body of capacitor 126 has a width of M, while a neck of capacitor 126 has a width of N. In at least one embodiment, M is equal to 3 microns and N is equal to 0.5 microns. Thus, when polysilicon layer 116 is deposited, the wider body of capacitor 126 receives only a thin layer of doped polysilicon, but the narrower neck is filled completely with doped silicon. When contacts are formed, contact 124 is formed to contact polysilicon layer 120 and a smaller contact 132 is formed to contact polysilicon layer 116.

Figure 11A:
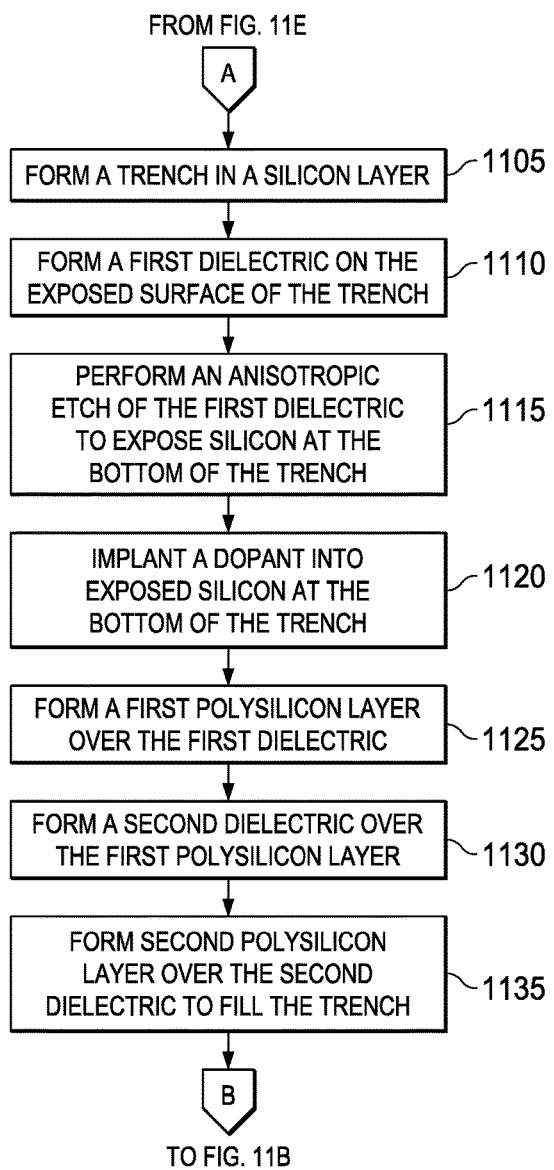

FIGS. 11A-E depict a simplified flowchart for a method of forming a trench capacitor in a semiconductor. The method begins in FIG. 11A with forming (1105) a trench in a silicon layer. After the trench is created, the method forms (1110) a first dielectric on the exposed surface of the trench, then performs (1115) an anisotropic etch of the first dielectric to expose silicon at the bottom of the trench. A dopant is implanted (1120) into the exposed silicon at the bottom of the trench, then a first polysilicon layer is formed (1125) over the first dielectric. A second dielectric layer is formed (1130) over the first polysilicon layer and a second polysilicon layer is formed (1135) over the second dielectric. This second polysilicon layer fills the trench. The method continues in FIG. 11B with etching (1140) the surface of the wafer to remove dielectric and polysilicon layers from the wafer surface. In FIG. 11C, the method continues with depositing (1145) a passivation layer over the wafer surface and in FIG. 11D further continues with forming (1150) a first contact that contacts the first polysilicon layer and forming (1155) a second contact that contacts the second polysilicon layer. In FIG. 11E, prior to forming the trench, the method forms (1160) a masking layer on the silicon layer.

Applicants have disclosed a capacitor that can be integrated with an existing flow that forms substrate contacts in a trench. In at least one embodiment, the disclosed capacitor adds no new masks and only two additional steps to the existing process, i.e., forming dielectric layer 118 and polysilicon layer 120.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A method of forming a trench capacitor in a semiconductor wafer comprising:
   forming a trench in a silicon layer;
   forming a first dielectric on the exposed surface of the trench;
   performing an anisotropic etch of the first dielectric to expose silicon at the bottom of the trench;
   implanting a dopant into the exposed silicon at the bottom of the trench;
   forming a first polysilicon layer over the first dielectric;
   forming a second dielectric over the first polysilicon layer;
   forming a second polysilicon layer over the second dielectric to completely fill the trench; and
   etching the surface of the wafer to remove the second dielectric layer, the first polysilicon layer, and the second polysilicon layer from over the semiconductor wafer surface outside of the trench after forming the second polysilicon layer.

2. The method as recited in claim 1, further comprising depositing a passivation layer on the semiconductor wafer surface.

3. The method as recited in claim 2 further comprising forming a first contact that contacts the first polysilicon layer and forming a second contact that contacts the second polysilicon layer.

4. The method as recited in claim 3 wherein the first contact is a substrate contact.

5. The method as recited in claim 3 wherein the first contact is formed in a neck of the trench capacitor, the neck having a smaller width than a body of the capacitor.

6. The method as recited in claim 3 further comprising, prior to forming the trench, forming a masking layer on the silicon layer.

7. The method as recited in claim 1 further comprising forming a substrate contact, wherein:
   forming the trench in the silicon layer also simultaneously forms a substrate contact trench in the silicon layer;
   the first dielectric is also simultaneously formed in the substrate contact trench; and
   forming the first polysilicon layer fills the substrate contact trench, wherein the first polysilicon layer remains filling the substrate contact trench when the second polysilicon layer is formed.

8. The method as recited in claim 1, wherein forming the first dielectric comprises growing a first thermal oxide.

9. The method as recited in claim 1, wherein forming the second dielectric comprises forming an oxide/nitride/oxynitride combination on sidewalls of the trench.

10. The method as recited in claim 9, wherein the oxide/nitride/oxynitride combination is formed to a thickness of between approximately 100 to 1000 angstroms.

11. The method as recited in claim 1, wherein implanting the dopant into the exposed silicon at the bottom of the trench forms a contact between the silicon layer and the first polysilicon layer.

12. A method of simultaneously forming a trench capacitor and a substrate contact in a semiconductor wafer, the method comprising:
   forming a first trench and a second trench in a silicon layer;
   forming a first dielectric on the exposed surface of the first and the second trenches;
   performing an anisotropic etch of the first dielectric to expose silicon at the bottom of the first and second trenches;
   implanting a dopant into exposed silicon at the bottom of the first and second trenches;
   forming a first polysilicon layer over the first dielectric, the first polysilicon layer lining the first trench and filling the second trench;
   forming a second dielectric over the first polysilicon layer; and
   forming a second polysilicon layer over the second dielectric to fill the first trench.

13. The method as recited in claim 12 further comprising depositing a passivation layer on the semiconductor wafer surface.

14. The method as recited in claim 13 further comprising forming a first contact that contacts the first polysilicon layer formed in the first trench, a second contact that contacts the first polysilicon layer in the second trench and a third contact that contacts the second polysilicon layer in the first trench.

15. The method as recited in claim 14, wherein the trench capacitor is formed in the first trench and the substrate contact is formed in the second trench.

* * * * *